US006774491B2

(12) United States Patent
Ahn

(10) Patent No.: US 6,774,491 B2
(45) Date of Patent: Aug. 10, 2004

(54) CONDUCTIVE LINES, COAXIAL LINES, INTEGRATED CIRCUITRY, AND METHODS OF FORMING CONDUCTIVE LINES, COAXIAL LINES, AND INTEGRATED CIRCUITRY

(75) Inventor: Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/887,049

(22) Filed: Jun. 21, 2001

(65) Prior Publication Data

US 2002/0009844 A1 Jan. 24, 2002

Related U.S. Application Data

(63) Continuation of application No. 08/917,003, filed on Aug. 20, 1997, now Pat. No. 6,294,455.

(51) Int. Cl.[7] .......................... H01L 23/48; H01L 23/52
(52) U.S. Cl. ..................... 257/773; 257/522; 257/642; 257/619; 438/411; 438/619
(58) Field of Search .......................... 257/522, 642, 257/619, 773, E23.013, 758; 438/411, 412, 619, 422, 421, 466, 623, 625, 626, 611; 29/840

(56) References Cited

U.S. PATENT DOCUMENTS

| 3,982,268 A | 9/1976 | Anthony et al. ............. 257/45 |
| 4,394,712 A | 7/1983 | Anthony .................... 361/779 |
| 4,419,150 A | 12/1983 | Soclof ....................... 438/337 |
| 4,440,973 A | 4/1984 | Hawkins ..................... 174/107 |
| 4,595,428 A | 6/1986 | Anthony et al. ............ 438/468 |
| 4,610,077 A | 9/1986 | Minahan et al. ............ 438/68 |
| 4,776,087 A | 10/1988 | Cronin et al. ................ 29/828 |
| 4,870,470 A | 9/1989 | Bass, Jr. et al. ............ 257/324 |
| 4,933,743 A | 6/1990 | Thomas et al. ............. 257/742 |
| 4,939,568 A | 7/1990 | Kato et al. .................. 257/686 |

(List continued on next page.)

FOREIGN PATENT DOCUMENTS

| EP | 0501407 A1 * | 2/1992 | ......... H01L/23/522 |
| EP | 0771026 A2 * | 10/1996 | ......... H01L/21/768 |
| EP | 0338190 A2 * | 4/1998 | ........... H01L/21/90 |
| JP | 4-133472 | 5/1992 | |

OTHER PUBLICATIONS

Merriam–Webster Online, http://www.m-w,com/home.htm.*

Thomas, M.E.; Saadat, I.A.; Sekigama, S.; VLSI Multilevel Micro–Coaxial Interconnects For High Speed Devices, Electron Devices Meeting, 1990. Technical Digest., International, Dec. 9–12, 1990, pp. 55–58.*

(List continued on next page.)

Primary Examiner—George Fourson
Assistant Examiner—Julio J. Maldonado
(74) Attorney, Agent, or Firm—Wells St. John P.S.

(57) ABSTRACT

Conductive lines, such as co-axial lines, integrated circuitry incorporating such conductive lines, and methods of forming the same are described. In one aspect, a substrate having an outer surface is provided. A masking material is formed over the outer surface and subsequently patterned to form a conductive line pattern. An inner conductive layer is formed within the conductive line pattern, followed by formation of a dielectric layer thereover and an outer conductive layer over the dielectric layer. Preferred implementations include forming the inner conductive layer through electroplating, or alternatively, electroless plating techniques. Other preferred implementations include forming the dielectric layer from suitable polymer materials having desired dielectric properties. A vapor-deposited dielectric layer of Parylene is one such preferred dielectric material.

32 Claims, 6 Drawing Sheets

U.S. PATENT DOCUMENTS

| | | | |
|---|---|---|---|
| 4,977,439 A | 12/1990 | Esquivel et al. | 257/621 |
| 5,000,818 A * | 3/1991 | Thomas et al. | 438/619 |
| 5,117,276 A * | 5/1992 | Thomas et al. | 257/758 |
| 5,148,260 A * | 9/1992 | Inoue et al. | 257/762 |
| 5,166,097 A | 11/1992 | Tanielian | 438/667 |
| 5,312,765 A | 5/1994 | Kanber | 438/59 |
| 5,317,197 A | 5/1994 | Roberts | 257/407 |
| 5,323,533 A * | 6/1994 | Val | 29/840 |
| 5,424,245 A | 6/1995 | Gurtler et al. | 438/107 |
| 5,426,072 A | 6/1995 | Finnila | 438/107 |
| 5,482,873 A | 1/1996 | Yang | 438/365 |
| 5,528,080 A | 6/1996 | Goldstein | 257/741 |
| 5,539,227 A | 7/1996 | Nakano | 257/276 |
| 5,539,256 A | 7/1996 | Mikagi | 257/763 |
| 5,541,567 A | 7/1996 | Fogel et al. | 336/200 |
| 5,587,119 A | 12/1996 | White | 264/104 |
| 5,596,230 A | 1/1997 | Hong | 257/758 |
| 5,599,744 A | 2/1997 | Koh et al. | 438/660 |
| 5,608,237 A | 3/1997 | Aizawa et al. | 257/132 |
| 5,614,743 A | 3/1997 | Mochizuki | 257/276 |
| 5,618,752 A | 4/1997 | Gaul | 438/624 |
| 5,635,423 A | 6/1997 | Huang et al. | 438/638 |
| 5,640,049 A | 6/1997 | Rostoker et al. | 257/758 |
| 5,646,067 A | 7/1997 | Gaul | 438/458 |
| 5,651,855 A | 7/1997 | Dennison et al. | 438/628 |
| 5,661,344 A | 8/1997 | Havemann et al. | 257/758 |
| 5,675,187 A * | 10/1997 | Numata et al. | 257/758 |
| 5,682,062 A | 10/1997 | Gaul | 257/686 |
| 5,698,867 A | 12/1997 | Bauer et al. | 257/138 |
| 5,699,291 A | 12/1997 | Tsunemine | 365/149 |
| 5,717,247 A | 2/1998 | Koh et al. | 257/686 |
| 5,750,436 A | 5/1998 | Yamaga et al. | 438/558 |
| 5,753,529 A | 5/1998 | Chang et al. | 438/118 |
| 5,767,001 A | 6/1998 | Bertagnolli et al. | 438/455 |
| 5,807,783 A | 9/1998 | Gaul et al. | 438/406 |
| 5,811,868 A | 9/1998 | Bertin et al. | 257/516 |
| 5,817,572 A | 10/1998 | Chiang et al. | 438/624 |
| 5,827,775 A | 10/1998 | Miles et al. | 438/622 |
| 5,841,197 A | 11/1998 | Adamic, Jr. | 257/777 |
| 5,852,320 A | 12/1998 | Ichihashi | 257/419 |
| 5,858,877 A | 1/1999 | Dennison et al. | 438/700 |
| 5,861,677 A | 1/1999 | You et al. | 257/783 |
| 5,869,893 A | 2/1999 | Koseki et al. | 257/723 |
| 5,930,625 A | 7/1999 | Lin et al. | 438/253 |
| 5,933,758 A | 8/1999 | Jain | 438/687 |
| 5,990,562 A | 11/1999 | Vallett | 257/774 |
| 6,001,538 A | 12/1999 | Chen et al. | 430/316 |
| 6,037,244 A | 3/2000 | Gardner et al. | 438/586 |
| 6,037,248 A | 3/2000 | Ahn | 438/619 |
| 6,143,616 A | 11/2000 | Geusic et al. | 438/389 |
| 6,184,121 B1 | 2/2001 | Buchwalter et al. | 438/622 |
| 6,187,677 B1 | 2/2001 | Ahn | 438/667 |
| 6,188,125 B1 | 2/2001 | Havemann | 257/640 |
| 6,194,313 B1 | 2/2001 | Singh et al. | 438/675 |
| 6,268,262 B1 * | 7/2001 | Loboda | 438/422 |
| 6,576,976 B2 * | 6/2003 | Lien et al. | 257/522 |

OTHER PUBLICATIONS

V. Lehrmann, "The Physics of Macropore Formation in Low Doped N–Type Silicon," J. Electrochem Soc., vol. 140, No. 10, Oct. 1993, pp. 2836–2843.

K. P. Muller et al., "Trench Storage Node Technology for Gigabit DRAM Generations," Technical Digest of International Electron Devices Meeting, Dec. 8–11, 1996, pp. 507–510.

H. Horie et al., "Novel High Aspect Ratio for Logic/DRAM LSIs Using Polysilicon–Aluminum Substitute (PAS)," Technical Digest of International Electron Devices Meeting, Dec. 8–11, 1996, pp. 946–948.

M. Thomas et al., "VLSI Multilevel Micro–Coaxial Interconnects for High Speed Devices," Fairchild Research Center, IEEE 1990, pp. 3.5.1–3.5.

T. Ohba et al., "Evaluation on Selective Deposition of CVD W Films by Measurement of Surface Temperature," Tungsten and Other Refractory Metals for VLSI Applications II, Proceedings of 1986 Workshop, pp. 59–66, 1987 by Materials Research Society.

R.F. Foster et al., "High Rate Low–Temperature Selective Tungsten," ibid. 1988 Workshop, pp. 69–72.

T. Ohba et al., "Selective Chemical Deposition of Tungsten Using Silane and Polysilicon Reduction," ibid, Workshop, pp. 17–25, 1989.

Guttman et al., "Low and High Dielectric Constant Thin Films for Integrated Circuit Applications", Extended Abstract, presented to the Advanced Metallization and Interconnect Systems for VLSI Applications in 1996, Oct. 3–5, Boston, MA.

Sekine et al., "A New High–Density Plasma Etching System Using a Dipole–Ring Magnet,"Jpn. J. Appl. Phys., 11/94, Pt. 1, No. 11.

K.J. Taylor et al., "Polymers for high performance interconnects," Materials for Advanced Metallization, 1994 Symp. On VLSI Techn. Digest of technical Papers, pp. 60–63.

U.S. patent application Ser. No. 09/095,774, Ahn, filed Jun. 10, 1998.

U.S. patent application Ser. No. 09/118,346, Geusic et al., filed Jul. 17, 1998

* cited by examiner

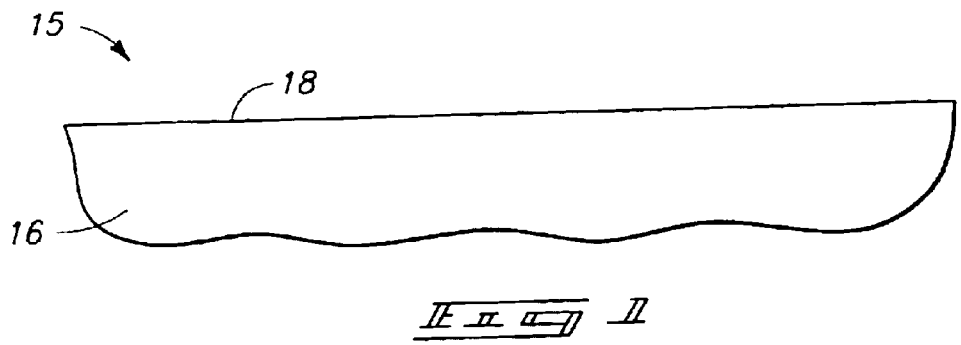
F I G. 1
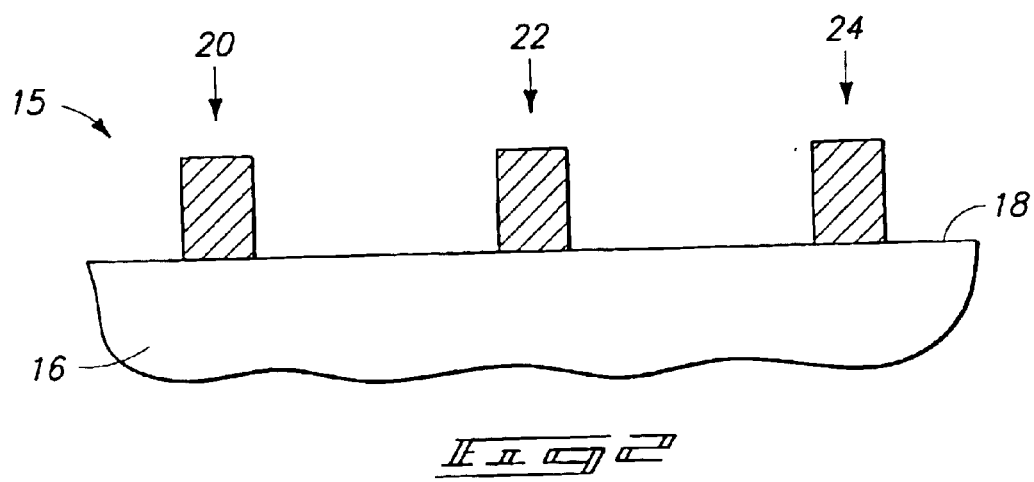
F I G. 2
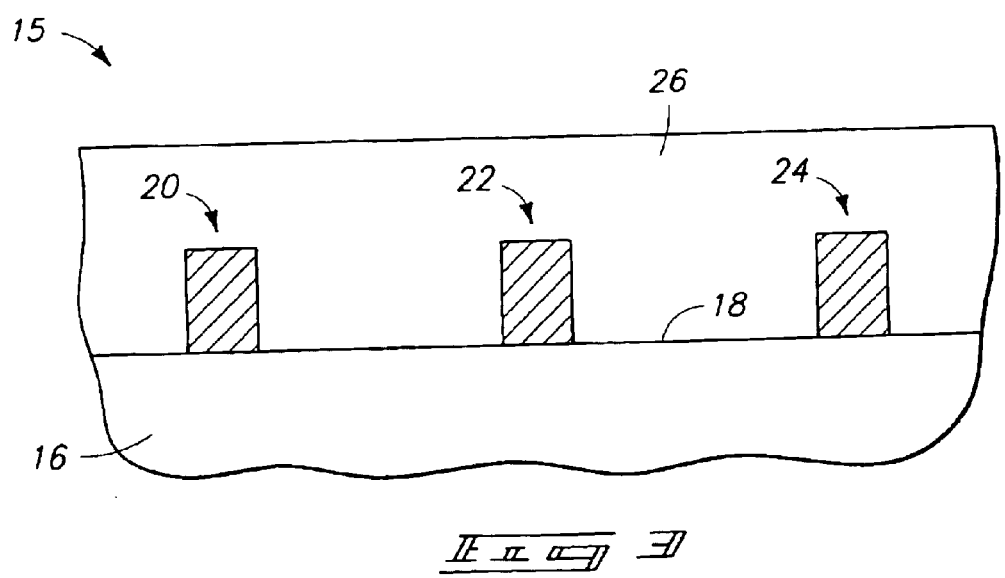
F I G. 3

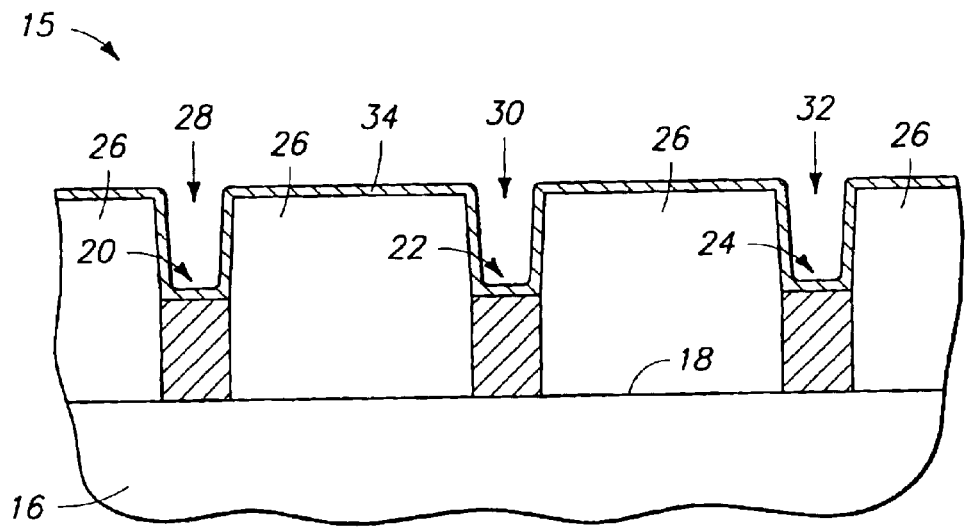
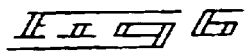
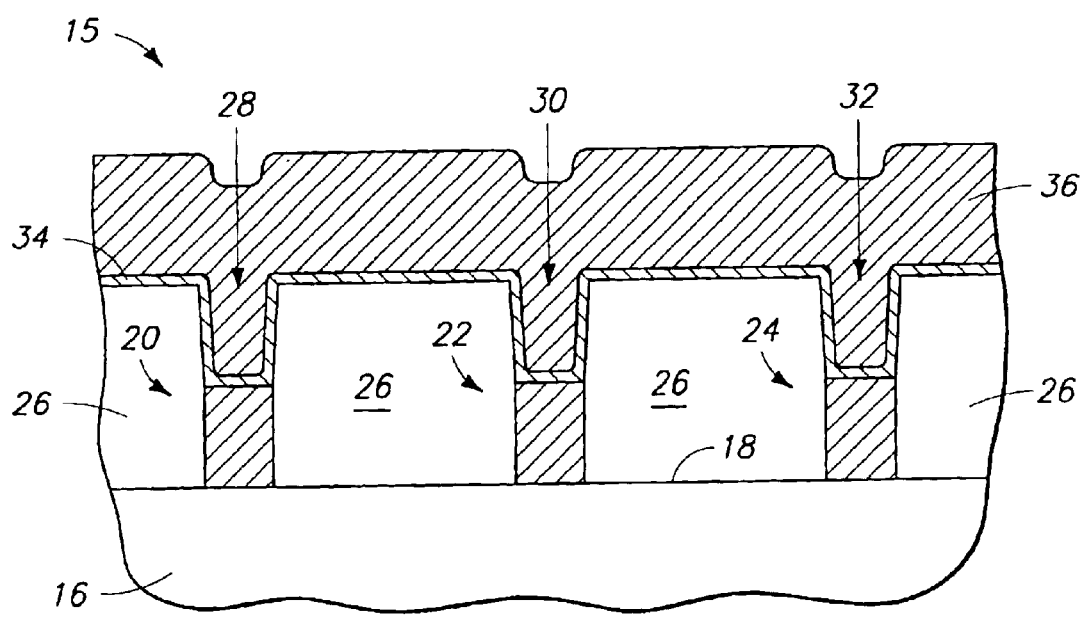
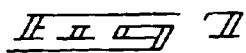

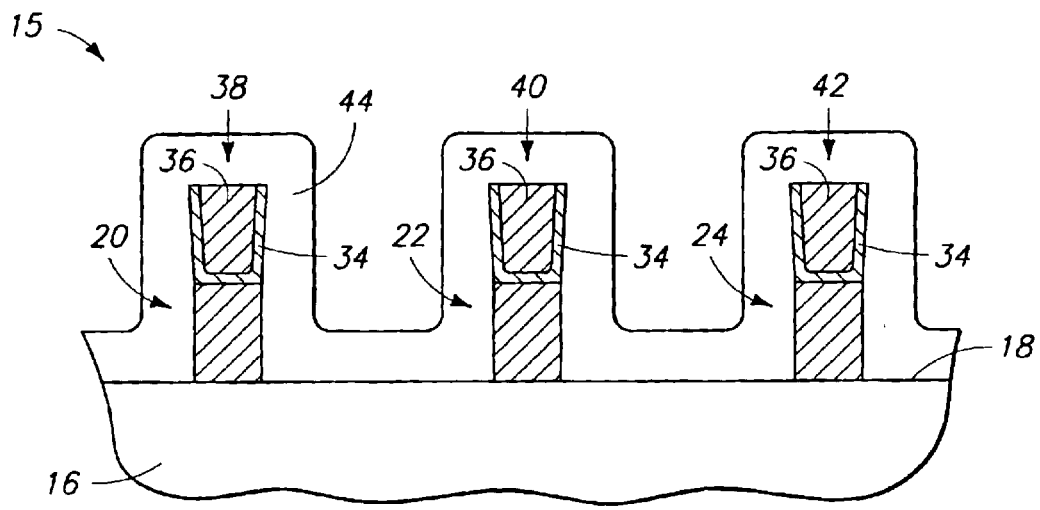
_FIG. 10_
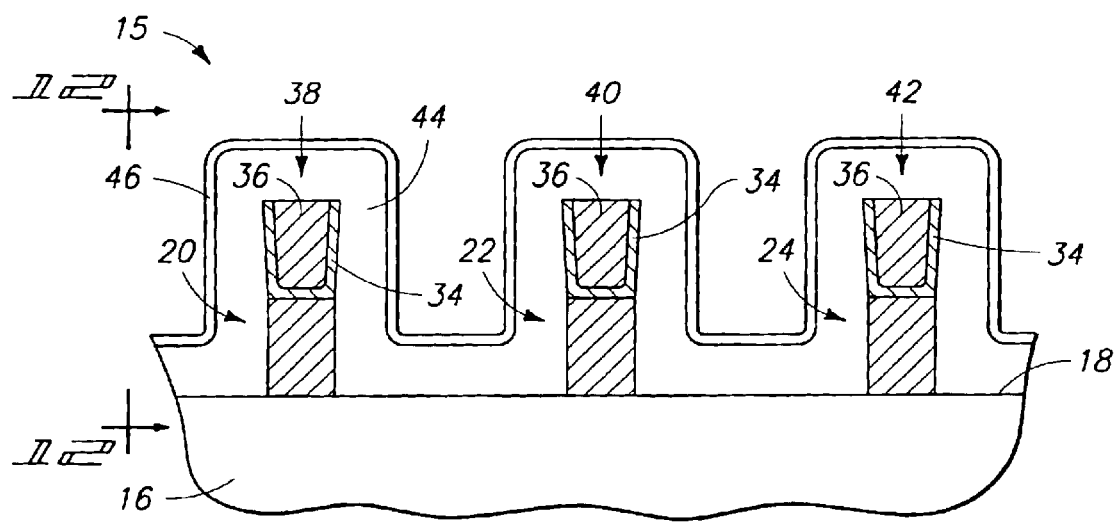
_FIG. 11_

CONDUCTIVE LINES, COAXIAL LINES, INTEGRATED CIRCUITRY, AND METHODS OF FORMING CONDUCTIVE LINES, COAXIAL LINES, AND INTEGRATED CIRCUITRY

CROSS REFERENCE TO RELATED APPLICATION

This patent application is a Continuation Application of U.S. patent application Ser. No. 08/917,003, filed Aug. 20, 1997, entitled "Conductive Lines, Coaxial Lines, Integrated Circuitry, and Methods of Forming Conductive Lines, Coaxial Lines, and Integrated Circuitry", naming Kie Y. Ahn as inventor, now U.S. Pat. No. 6,294,455.

TECHNICAL FIELD

This invention relates to methods of forming conductive lines, such as co-axial lines, and to integrated circuitry incorporating conductive lines.

BACKGROUND OF THE INVENTION

As the density of integrated circuitry (IC) devices increases, continuing challenges are posed to find interconnect structures which are suitable for use with such densely-packed IC devices. For example, as clock cycles increase, interconnect structures which are capable of handling such clock cycles become necessary. Further, such interconnect structures must overcome concerns associated with signal propagation times, crosstalk, increased system noise and other spurious electrical effects which are detrimental to the performance of integrated circuits.

This invention arose out of concerns associated with providing integrated circuitry interconnect structures which are suitable for use with densely-packed, high-speed integrated circuitry devices.

SUMMARY OF THE INVENTION

Conductive lines, such as co-axial lines, integrated circuitry incorporating such conductive lines, and methods of forming the same are described. In one aspect, a substrate having an outer surface is provided. A masking material is formed over the outer surface and subsequently patterned to form a conductive line pattern. An inner conductive layer is formed within the conductive line pattern, followed by formation of a dielectric layer thereover and an outer conductive layer over the dielectric layer. Preferred implementations include forming the inner conductive layer through electroplating, or alternatively, electroless plating techniques. Other preferred implementations include forming the dielectric layer from suitable polymer materials having desired dielectric properties. A vapor-deposited dielectric layer of parylene is one such preferred dielectric material.

BRIEF DESCRIPTION OF THE DRAWINGS

Preferred embodiments of the invention are described below with reference to the following accompanying drawings.

FIG. 1 illustrates a cross-sectional view of a semiconductor wafer fragment at a preliminary processing step according to the present invention.

FIG. 2 illustrates the semiconductor wafer fragment of FIG. 1 at one processing step in accordance with one aspect of the invention subsequent to that of FIG. 1.

FIG. 3 illustrates the semiconductor wafer fragment of FIG. 1 at a processing step subsequent to that of FIG. 2.

FIG. 6 illustrates the semiconductor wafer fragment of FIG. 1 at a processing step subsequent to that of FIG. 4, and in accordance with one embodiment of the present invention.

FIG. 7 illustrates the semiconductor wafer fragment of FIG. 1 at a processing step subsequent to that of FIG. 6.

FIG. 10 illustrates the semiconductor wafer fragment of FIG. 1 at a processing step subsequent to that of FIG. 9.

FIG. 11 illustrates the semiconductor wafer fragment of FIG. 1 at a processing step subsequent to that of FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is indicated generally at 15, and includes a semiconductive substrate 16 having an outer surface 18. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 12:
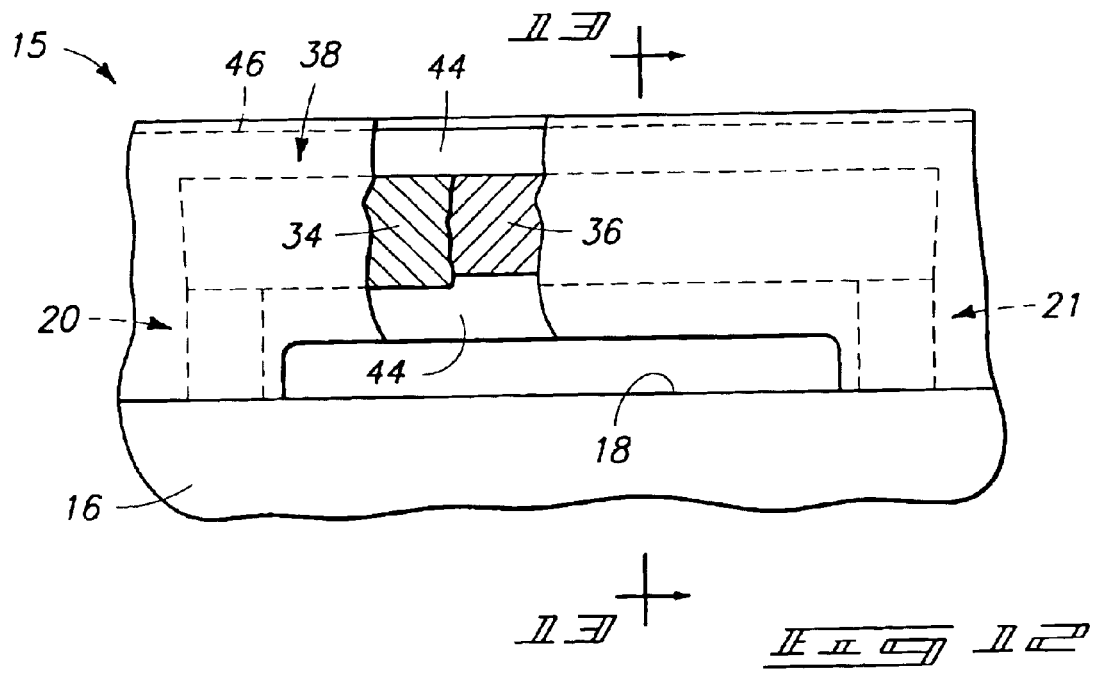
FIG. 12 is a view taken along line 12—12 in FIG. 11.

Referring to FIG. 2, conductive terminal members 20, 22, and 24 are formed over outer surface 18. Such constitute exemplary respective node locations with which electrical connection or communication is desired. In accordance with one aspect of the invention, other conductive terminal members are formed over the substrate and extend into and out of the plane of the page upon which FIG. 2 appears. Such other conductive terminal members can form, together with the illustrated terminal members, respective pairs of upstanding, spaced-apart terminal members. One such exemplary pair is shown in FIG. 12 at 20, 21 and discussed in more detail below.

Referring to FIG. 3, a first masking material layer 26 is formed over substrate 16 and the illustrated conductive terminal members. Accordingly, first layer 26 is formed over and between conductive terminal members which lie into and out of the plane of the page upon which FIG. 3 appears. An exemplary masking material is photoresist, although other masking materials can, of course, be used.

Figure 4:
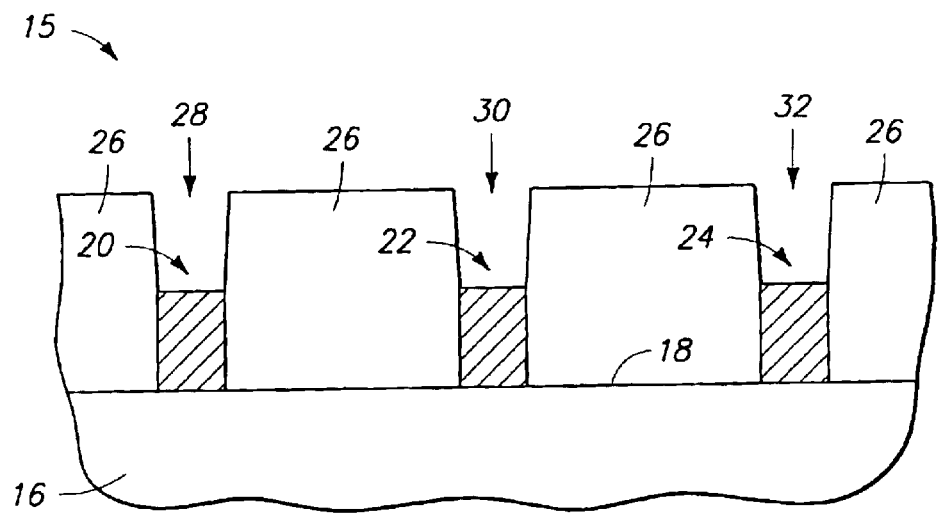
FIG. 4 illustrates the semiconductor wafer fragment of FIG. 1 at a processing step subsequent to that of FIG. 3.
Figure 5:
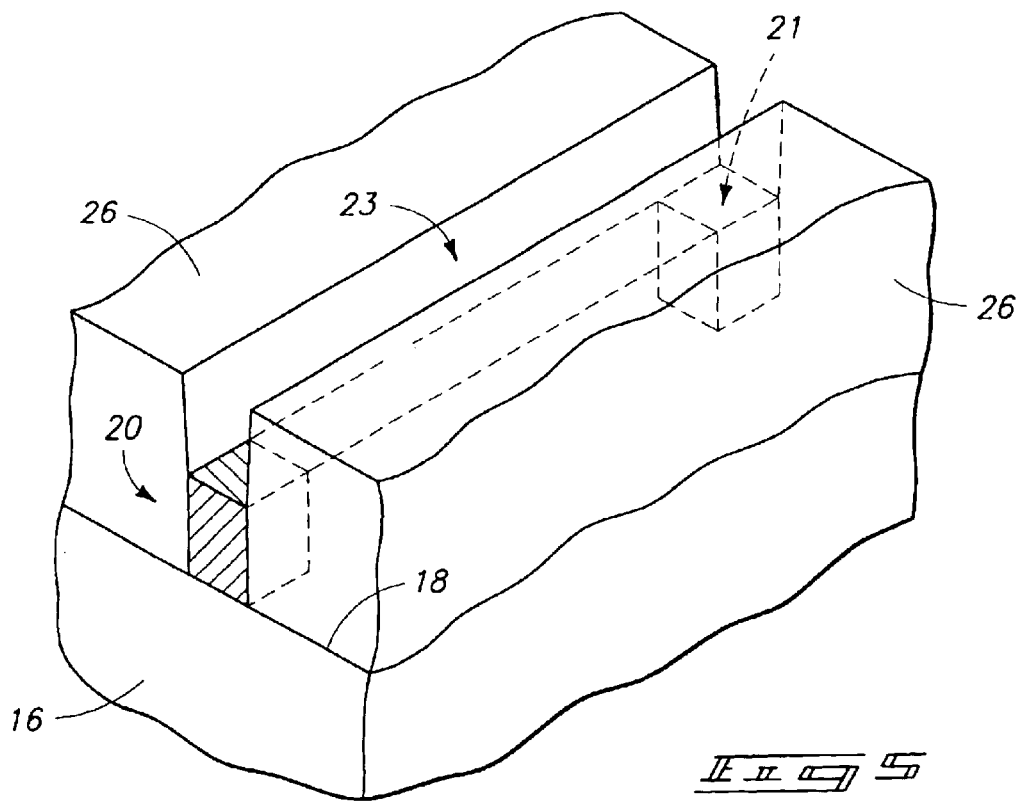
FIG. 5 is an isometric elevation of a portion of the semiconductor wafer fragment of FIG. 1 at the FIG. 4 processing step.

Referring to FIG. 4, first layer 26 is patterned over outer surface 18 to form at least one, and preferably a plurality, of conductive line patterns 28, 30, and 32. In one aspect, conductive line patterns 28, 30, and 32 expose at least portions of respective conductive terminal members 20, 22, and 24 and their respective mated terminal members which define the respective pairs of upstanding terminal members mentioned above. Ideally, and with reference to FIG. 5, this forms a trough 23 through first layer 26 which extends between and joins respective terminal member pairs such as exemplary pairs 20, 21. Yet, trough 23 does not extend to surface 18. Such can be accomplished by limiting the time of light exposure of the preferred photoresist of layer 26 such that only an outermost portion is light transformed for subsequent stripping. Alternately, where layer 26 constitutes another material such as $SiO_2$, the formation of a trough between the silicon pairs in a manner which avoids surface 18 exposure could be achieved with a masked timed etch. An etch stop layer might also be used. Regardless, the trough formation enables the spaced-apart conductive terminal members, such as terminal members 20, 21, to be electrically connected through the respective conductive line patterns, as will become apparent below.

Referring to FIG. 6, and in accordance with a first preferred implementation, a first conductive layer 34 is formed over substrate 16 and within conductive line patterns 28, 30, and 32. Such layer can be formed through any suitable technique. An exemplary technique is sputtering or otherwise blanket-depositing layer 34 over the substrate. In a preferred aspect, the sputtering is conducted in connection with an ionized magnetron sputtering reactor in order to ensure adequate step coverage within the illustrated conductive line patterns. Typical and exemplary materials for layer 34 include a bi-layer comprising titanium and copper, or chromium and copper. Such layer is preferably deposited to a thickness from between about 100 to 200 nanometers. Such layer forms a so-called seed layer for an electroplating process as described below.

Referring to FIG. 7, a second conductive layer 36 is formed over substrate 16, within conductive line patterns 28, 30, and 32, and over layer 34, preferably by electroplating techniques. Together, material of first layer 34 and second layer 36 will constitute an inner conductive layer or core of material which is formed within the line patterns. Exemplary materials for layer 36 include those materials which are suitable for use in electroplating processes, such as metal-comprising materials like copper and gold. Additionally, magnetic films comprising nickel, cobalt, and iron, and suitable alloys thereof can be used.

Figure 8:
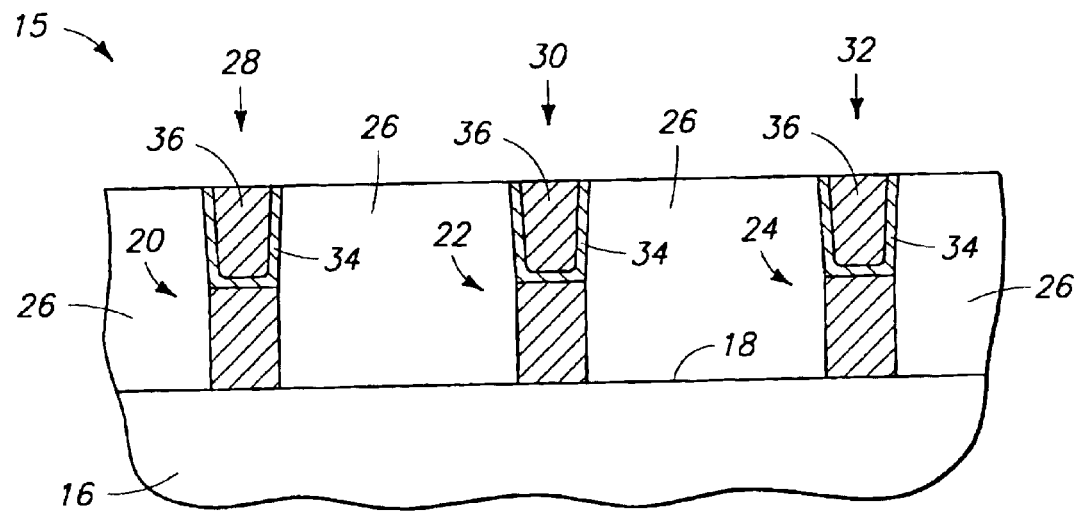
FIG. 8 illustrates the semiconductor wafer fragment of FIG. 1 at a processing step subsequent to that of FIG. 7.

Referring to FIG. 8, amounts of layers 34, 36 are removed to effectively electrically isolate conductive material within the respective conductive line patterns 28, 30, and 32. In a preferred aspect, the conductive material is planarized as by suitable chemical mechanical polishing thereof relative to masking layer 26. This forms individual inner conductive layers or cores which extend between and operably connect with individual terminal members of each respective pair.

In accordance with another preferred implementation, and one which follows from the FIG. 4 construction, the conductive material which is formed or provided within conductive line patterns 28, 30, and 32 can be formed through suitable known electroless plating techniques. Accordingly, only one layer of conductive material could be formed over the substrate and within the conductive line patterns. Processing in accordance with this implementation, after the formation of the conductive material layer, would otherwise take place substantially as described herein with respect to the first implementation.

Figure 9:
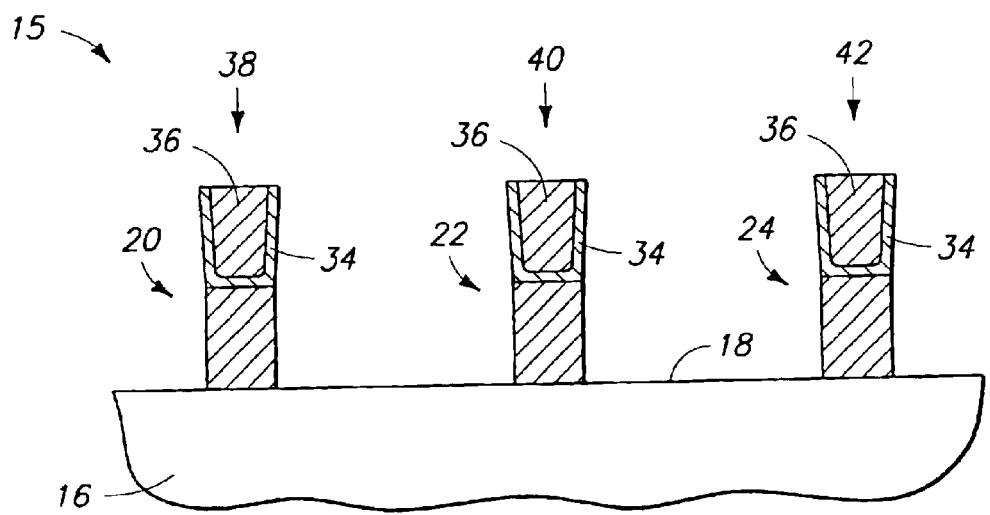
FIG. 9 illustrates the semiconductor wafer fragment of FIG. 1 at a processing step subsequent to that of FIG. 8.

Referring to FIGS. 9 and 12, masking material 26 is removed from at least around conductive material portions which extend between respective spaced-apart conductive terminal members, such as pair 20, 21 of FIG. 12. The conductive material portions comprise conductive lines 38, 40, and 42 which include other portions which are supported above, spaced from, or otherwise suspended over substrate outer surface 18 by the respective terminal members 20, 22, and 24. Accordingly, masking material is removed from elevationally below the conductive material portions which extend between the terminal members, thereby leaving such portions supported above the underlying substrate outer surface 18. Masking material 26 can be removed through any suitable technique such as oxygen plasma etching.

Referring to FIG. 10, a dielectric layer 44 is formed over substrate 16 and at least some of the inner conductive layers comprising respective conductive lines 38, 40, and 42. Preferably, layer 44 comprises a dielectric polymer layer which is formed over and surrounds at least the respective portions of conductive lines 38, 40, and 42 which are spaced from outer surface 18 and extend between the terminal members. An example material is parylene. Parylene desirably has a lower dielectric constant, e.g. 2.6, as compared with dielectric constants of other materials such as $SiO_2$ which can have dielectric constants from between 3.9 to 4.2. Such accommodates operating parameters of high speed integrated circuitry by increasing signal propagation (decreasing propagation times) and reducing interline coupling or crosstalk. The preferred parylene material is preferably vapor phase deposited over the substrate and the respective conductive lines. Parylene and processing techniques which utilize parylene are described in more detail in an article entitled "Low and High Dielectric Constant Thin Films for Integrated Circuit Applications", authored by Guttman et al., and presented to the Advanced Metallization and Interconnect Systems for VLSI Applications in 1996, held in Boston, Mass., Oct. 3–5, 1996, and published in May/June 1997 by Material Research Society of Pittsburgh, Pa.

Preferably, dielectric layer 44 surrounds a substantial portion of the conductive material which constitutes conductive lines 38, 40, and 42. In accordance with one aspect of the invention, the substantial portion of such material constitutes that portion of material which is suspended above outer surface 18. Such is more easily seen when FIGS. 10 and 12 are viewed together.

Referring to FIG. 11, an outer conductive sheath 46 is formed over dielectric layer 44. Preferably, conductive sheath 46 constitutes a metal-comprising layer of material formed by chemical vapor deposition. Aluminum is an example preferred material. Layer 46 forms a coaxial outer conductive line component which is formed over dielectric layer 44.

Figure 13:
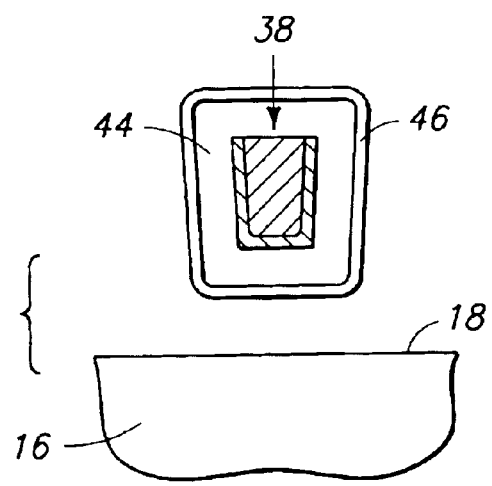
FIG. 13 is a view taken along line 13—13 in FIG. 12.
Figure 12:
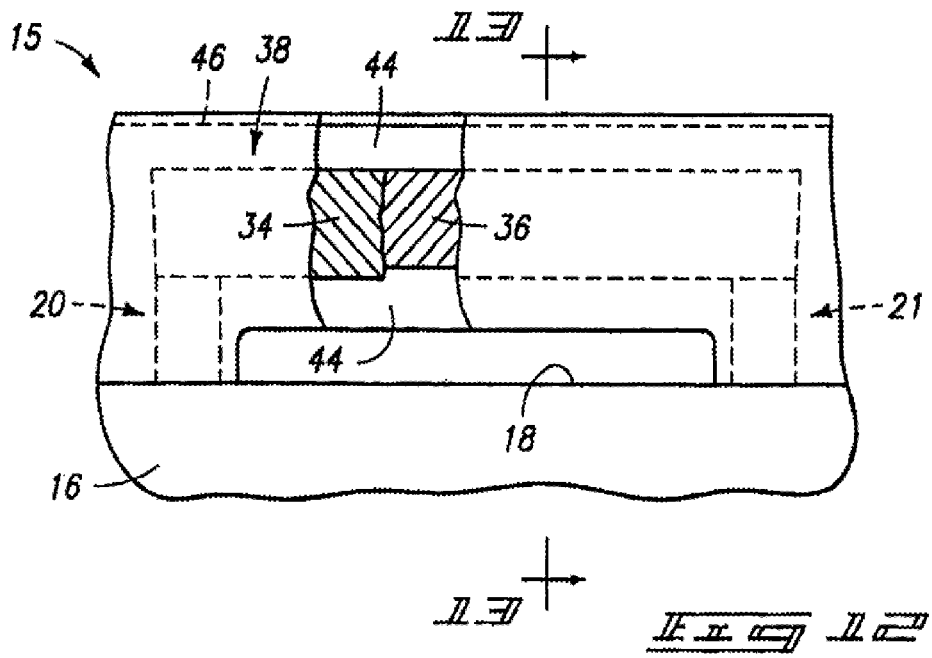
Figure 13:
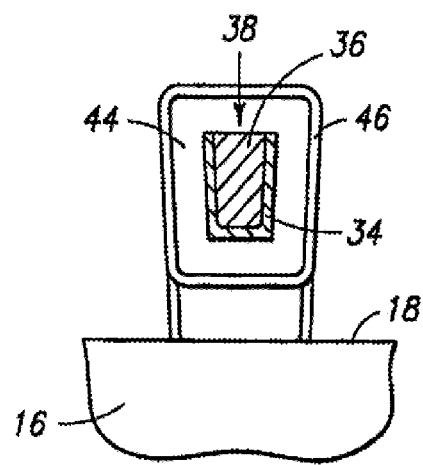
Figure 12:
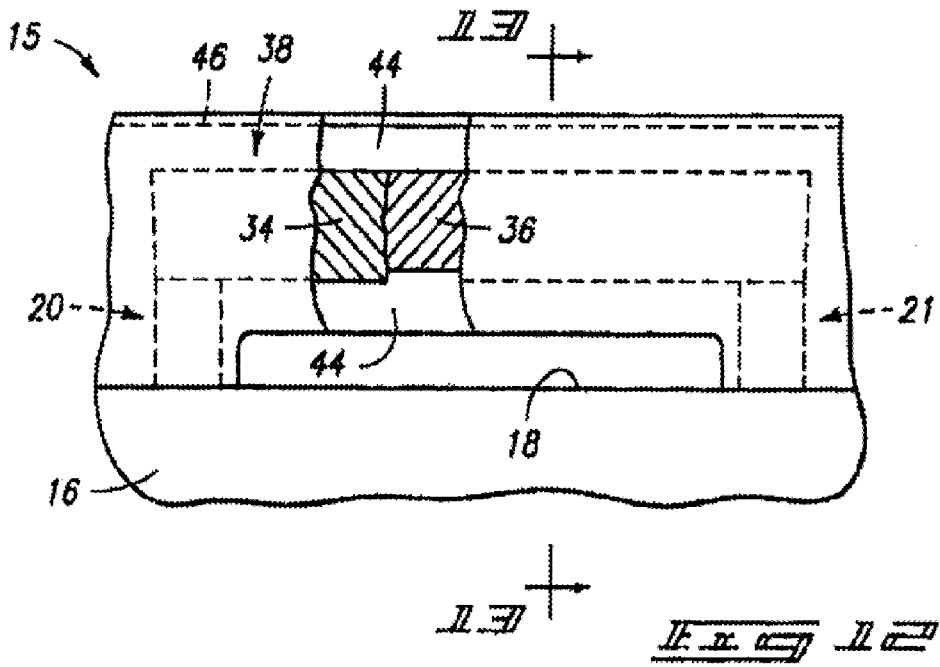
Figure 13:
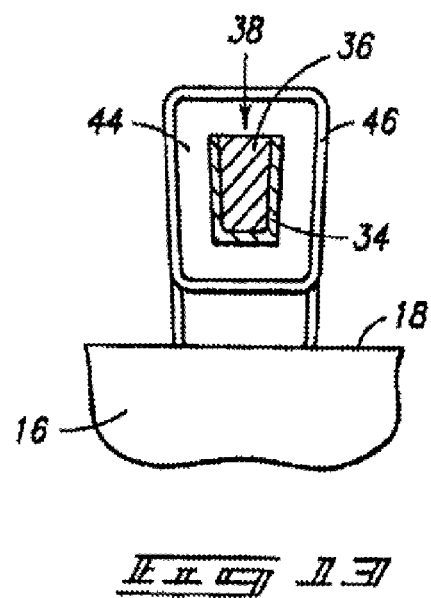

Referring to FIGS. 12 and 13, an exemplary upstanding pair of conductive terminal members 20, 21 (FIG. 12) are shown which illustrate a portion of conductive line 38 which is suspended above substrate outer surface 18. A portion of FIG. 12 has been broken away for clarity.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

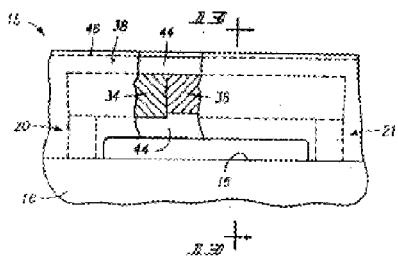

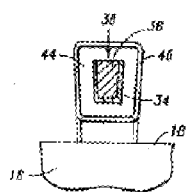

What is claimed is:

1. Integrated circuitry comprising:
    a semiconductive substrate having an outer surface;
    an inner conductive core spaced from and over the outer surface;
    a polymer dielectric layer surrounding a substantial portion of the inner conductive core; and
    an outer conductive sheath surrounding a substantial portion of the polymer dielectric layer, wherein the outer conductive sheath is not formed directly on the outer surface.

2. Integrated circuitry comprising:
    a semiconductive substrate having an outer surface;
    a pair of spaced-apart terminal members disposed over the outer surface and extending elevationally away therefrom;
    an inner conductive core operably connected with and suspend between the spaced-apart terminal members-above the outer surface;
    a polymer dielectric layer over a substantial portion of the inner conductive core; and
    an outer conductive sheath surrounding a substantial portion of the polymer dielectric layer, wherein the outer conductive sheath is not formed directly on the outer surface.

3. Integrated circuitry comprising:
    a substrate having an outer surface;
    a pair of upstanding, spaced-apart conductive terminal members disposed over the substrate outer surface;
    a copper-comprising layer of material operably connected with and suspended above the outer surface between the terminal members, the copper-comprising layer having a thickness of between about 100 to 200 nanometers;
    a conductive layer of material disposed over and operably connected with the copper-comprising layer of material, the conductive layer comprising conductive material selected from the group consisting of copper, gold, nickel, cobalt, and iron;
    a dielectric layer comprising parylene disposed over the conductive layer of material, the dielectric layer surrounding conductive layer portions which extend between the terminal members; and
    an outer conductive sheath of material disposed over the dielectric layer and surrounding dielectric layer portions which extend between the terminal members, wherein the outer conductive sheath is not formed directly on the outer surface.

4. The integrated circuitry of claim 1, wherein the polymer dielectric layer comprises parylene.

5. The integrated circuitry of claim 1, wherein the polymer dielectric layer has a relative dielectric constant of about 2.6.

6. The integrated circuitry of claim 1, wherein the outer conductive sheath comprises aluminum.

7. The integrated circuitry of claim 1, wherein the inner conductive core comprises copper.

8. The integrated circuitry of claim 1, wherein the inner conductive core comprises a material chosen from a group consisting of nickel, cobalt and iron.

9. The integrated circuitry of claim 2, wherein the polymer dielectric layer comprises parylene.

10. The integrated circuitry of claim 2, wherein the polymer dielectric layer has a relative dielectric constant of about 2.6.

11. The integrated circuitry of claim 2, wherein the outer conductive sheath comprises aluminum.

12. The integrated circuitry of claim 2, wherein the inner conductive core comprises copper.

13. The integrated circuitry of claim 2, wherein the inner conductive core comprises a material chosen from a group consisting of nickel, cobalt and iron.

14. Integrated circuitry comprising:
    a semiconductive substrate having an outer surface;
    an inner conductive core spaced from and over the outer surface;
    a polymer dielectric layer surrounding a substantial portion of the suspended inner conductive core; and
    an outer conductive sheath surrounding a substantial portion of the polymer dielectric layer, the outer conductive sheath leaving some void space between the outer conductive sheath and the outer surface, wherein the outer conductive sheath is not formed directly on the outer surface.

15. The integrated circuitry of claim 14, wherein the polymer dielectric layer comprises parylene.

16. The integrated circuitry of claim 14, wherein the polymer dielectric layer has a relative dielectric constant of about 2.6.

17. The integrated circuitry of claim 14, wherein the outer conductive sheath comprises aluminum.

18. The integrated circuitry of claim 14, wherein the inner conductive core comprises copper.

19. The integrated circuitry of claim 14, wherein the inner conductive core comprises a material chosen from a group consisting of nickel, cobalt and iron.

20. Integrated circuitry comprising:
    a semiconductive substrate having an outer surface;
    a pair of spaced-apart terminal members disposed over the outer surface and extending elevationally away therefrom;
    an inner conductive core operably connected with and suspended between the spaced-apart terminal members above the outer surface;
    a polymer dielectric layer surrounding the suspended inner conductive core; and
    an outer conductive sheath surrounding a substantial portion of the polymer dielectric layer while some void space is present between the dielectric layer over the suspended inner conductive core and the outer surface, the outer conductive sheath leaving some void space between the outer conductive sheath and the outer surface, wherein the outer conductive sheath is not formed directly on the substrate outer surface.

21. The integrated circuitry of claim 20, wherein the polymer dielectric layer comprises parylene.

22. The integrated circuitry of claim 20, wherein the polymer dielectric layer has a relative dielectric constant of about 2.6.

23. The integrated circuitry of claim 20, wherein the outer conductive sheath comprises aluminum.

24. The integrated circuitry of claim 20, wherein the inner conductive core comprises copper.

25. The integrated circuitry of claim 20, wherein the inner conductive core comprises a material chosen from a group consisting of nickel, cobalt and iron.

26. Integrated circuitry comprising:
    a substrate having an outer surface;
    a pair of upstanding, spaced-apart conductive terminal members disposed over the substrate outer surface;

a copper-comprising layer of material operably connected with and suspended above the outer surface between the terminal members, the copper-comprising layer having a thickness of between about 100 to 200 nanometers;

a conductive layer of material operably connected with the copper-comprising layer of material and suspended above the outer surface between the terminal members, the conductive layer comprising conductive material selected from the group consisting of copper, gold, nickel, cobalt, and iron;

a dielectric layer comprising parylene disposed over the conductive layer of material, the dielectric layer surrounding the suspended conductive layer portions; and an outer conductive sheath of material disposed over the dielectric layer and surrounding dielectric layer portions which extend between the terminal members, the outer conductive sheath leaving some void space between the outer conductive sheath and the outer surface, wherein the outer conductive sheath is not formed directly on the substrate outer surface.

27. The integrated circuitry of claim 26, wherein the copper-comprising layer and the conductive layer of material operably connected with the copper comprising layer together define an inner conductive core that includes at least two different conductive materials.

28. The integrated circuitry of claim 26, wherein the outer conductive sheath comprises aluminum.

29. Integrated circuitry comprising:

a semiconductive substrate having an outer surface;

a pair of spaced-apart terminal members disposed over the outer surface and extending elevationally away therefrom;

an inner conductive core operably connected with and suspended between the spaced-apart terminal members above the outer surface;

a polymer dielectric layer surrounding the suspended inner conductive core; and an outer conductive sheath surrounding a substantial portion of the polymer dielectric layer while some void space is present between the dielectric layer over the suspended inner conductive core and the outer surface, the outer conductive sheath leaving some void space between the outer conductive sheath and the outer surface, wherein the outer conductive sheath is not formed directly on the substrate outer surface, wherein the void space is formed by removing masking material from elevationally below conductive material portions extending between the pair of spaced-apart terminal members.

30. Integrated circuitry comprising:

a semiconductive substrate having an outer surface;

an inner conductive core spaced from and suspended over the outer surface;

a polymer dielectric layer surrounding a substantial portion of the inner conductive core; and an outer conductive sheath completely surrounding the polymer dielectric layer, wherein the outer conductive sheath is not directly formed on the outer surface.

31. Integrated circuitry comprising:

a semiconductive substrate having an outer surface;

a pair of spaced-apart terminal members disposed over the outer surface;

an inner conductive core operably connected with and suspended between the spaced-apart terminal members above the outer surface;

a polymer dielectric layer surrounding the suspended inner conductive core; and an outer conductive sheath surrounding a substantial portion of the polymer dielectric layer while leaving some void space between the outer conductive sheath and the outer surface.

32. The integrated circuitry of claim 32, wherein the polymer dielectric layer comprises parylene.

* * * * *

UNITED STATES PATENT AND TRADEMARK OFFICE
CERTIFICATE OF CORRECTION

| | | |
|---|---|---|
| PATENT NO. | : 6,774,491 B2 | |
| APPLICATION NO. | : 09/887049 | |
| DATED | : August 10, 2004 | |
| INVENTOR(S) | : Kie Y. Ahn | |

It is certified that error appears in the above-identified patent and that said Letters Patent is hereby corrected as shown below:

On the Title Page
Page 2 Item -56- OTHER PUBLICATIONS, please delete "V. Lehrmann," before "The Physics" and insert --V. Lehmann--.

Delete Drawing Sheet 1, and substitute therefor Drawing Sheet consisting of Fig. 12 as shown on attached page.

In the formal drawings, sheet 6 of 6. Please see attached correct drawing sheet.

Col. 1, line 9, please delete "Continuation" after "is a" and insert --Divisional--.

Col. 5, line 4, claim 1, please insert --suspended-- after "from and".

Col. 5, line 19, claim 1, please delete "suspend" before "between" and insert --suspended--.

Col. 5, line 19, claim 1, please delete "members-" after "terminal" and insert --members--.

Col. 6, line 10, claim 14, please insert --suspended-- after "from and".

Col. 8, line 36, claim 32, please delete "32" after "claim" and insert --31--.

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,774,491 B2  Page 1 of 3
APPLICATION NO. : 09/887049
DATED : August 10, 2004
INVENTOR(S) : Kie Y. Ahn It is certified that error appears in the above-identified patent and that said Letters Patent is hereby corrected as shown below:

Delete the title page and substitute therefor the attached title page.

On the Title Page
Page 2 Item -56- OTHER PUBLICATIONS, please delete "V. Lehrmann," before "The Physics" and insert --V. Lehmann--.

Delete Drawing Sheet 6 of 6 and substitute therefor Drawing Sheet 6 of 6 as shown on attached page.

In the formal drawings, sheet 6 of 6. Please see attached correct drawing sheet.

Col. 1, line 9, please delete "Continuation" after "is a" and insert --Divisional--.

Col. 5, line 4, claim 1, please insert --suspended-- after "from and".

Col. 5, line 19, claim 1, please delete "suspend" before "between" and insert --suspended--.

Col. 5, line 19, claim 1, please delete "members-" after "terminal" and insert --members--.

Col. 6, line 10, claim 14, please insert --suspended-- after "from and".

Col. 8, line 36, claim 32, please delete "32" after "claim" and insert --31--.

This certificate supersedes the Certificate of Correction issued May, 27, 2008.

Signed and Sealed this

First Day of July, 2008

JON W. DUDAS
*Director of the United States Patent and Trademark Office*

United States Patent
Ahn

(10) Patent No.: US 6,774,491 B2
(45) Date of Patent: Aug. 10, 2004

(54) CONDUCTIVE LINES, COAXIAL LINES, INTEGRATED CIRCUITRY, AND METHODS OF FORMING CONDUCTIVE LINES, COAXIAL LINES, AND INTEGRATED CIRCUITRY

(75) Inventor: Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/887,049

(22) Filed: Jun. 21, 2001

(65) Prior Publication Data

US 2002/0009844 A1 Jan. 24, 2002

Related U.S. Application Data

(63) Continuation of application No. 08/917,003, filed on Aug. 20, 1997, now Pat. No. 6,294,455.

(51) Int. Cl.$^7$ .............. H01L 23/48; H01L 23/52
(52) U.S. Cl. .............. 257/773; 257/522; 257/642; 257/619; 438/411; 438/619
(58) Field of Search .............. 257/522, 642, 257/619, 773, E23.013, 758; 438/411, 412, 619, 422, 421, 466, 623, 625, 626, 611; 29/840

(56) References Cited

U.S. PATENT DOCUMENTS

| 3,982,268 A | 9/1976 | Anthony et al. ........ 257/45 |
| 4,394,712 A | 7/1983 | Anthony ................ 361/779 |
| 4,419,150 A | 12/1983 | Soclof ................. 438/337 |
| 4,440,973 A | 4/1984 | Hawkins ............... 174/107 |
| 4,595,428 A | 6/1986 | Anthony et al. ........ 438/468 |
| 4,610,077 A | 9/1986 | Minahan et al. ........ 438/68 |
| 4,776,087 A | 10/1988 | Cronin et al. ......... 29/828 |
| 4,870,470 A | 9/1989 | Bass, Jr. et al. ...... 257/324 |
| 4,933,743 A | 6/1990 | Thomas et al. ......... 257/742 |
| 4,939,568 A | 7/1990 | Kato et al. ........... 257/686 |

(List continued on next page.)

FOREIGN PATENT DOCUMENTS

| EP | 0501407 A1 * | 2/1992 | ...... H01L/23/522 |
| EP | 0771026 A2 * | 10/1996 | ...... H01L/21/768 |
| EP | 0338190 A2 * | 4/1998 | ...... H01L/21/90 |
| JP | 4-133472 | 5/1992 | |

OTHER PUBLICATIONS

Merriam-Webster Online, http://www.m-w.com/home.htm.*
Thomas, M.E.; Saadat, I.A.; Sekigama, S.; VLSI Multilevel Micro-Coaxial Interconnects For High Speed Devices, Electron Devices Meeting, 1990. Technical Digest., International, Dec. 9–12, 1990, pp. 55–58.*

(List continued on next page.)

*Primary Examiner*—George Fourson
*Assistant Examiner*—Julio J. Maldonado
(74) *Attorney, Agent, or Firm*—Wells St. John P.S.

(57) ABSTRACT

Conductive lines, such as co-axial lines, integrated circuitry incorporating such conductive lines, and methods of forming the same are described. In one aspect, a substrate having an outer surface is provided. A masking material is formed over the outer surface and subsequently patterned to form a conductive line pattern. An inner conductive layer is formed within the conductive line pattern, followed by formation of a dielectric layer thereover and an outer conductive layer over the dielectric layer. Preferred implementations include forming the inner conductive layer through electroplating, or alternatively, electroless plating techniques. Other preferred implementations include forming the dielectric layer from suitable polymer materials having desired dielectric properties. A vapor-deposited dielectric layer of Parylene is one such preferred dielectric material.

32 Claims, 6 Drawing Sheets